(12) United States Patent
Harkema et al.

(10) Patent No.: US 12,349,286 B2
(45) Date of Patent: Jul. 1, 2025

(54) RECYCLABLE ELECTRONIC DEVICE

(71) Applicant: Nederlandse Organisatie voor toegepast-natuurwetenschappelijk onderzoek TNO, 's-Gravenhage (NL)

(72) Inventors: Stephan Harkema, Hilversum (NL); Jean-Pierre Teunissen, Weert (NL); Cornelis Hermanus Arnoldus Rentrop, Eindhoven (NL); Margaretha Maria De Kok, Eindhoven (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 18/683,929

(22) PCT Filed: Aug. 29, 2022

(86) PCT No.: PCT/NL2022/050492
§ 371 (c)(1),
(2) Date: Feb. 15, 2024

(87) PCT Pub. No.: WO2022/220688
PCT Pub. Date: Oct. 20, 2022

(65) Prior Publication Data
US 2024/0431037 A1  Dec. 26, 2024

(30) Foreign Application Priority Data
Aug. 30, 2021 (EP) .................................. 21193837

(51) Int. Cl.
*H05K 3/28* (2006.01)
*H05K 1/03* (2006.01)
(Continued)

(52) U.S. Cl.
CPC .......... *H05K 3/284* (2013.01); *H05K 1/0393* (2013.01); *H05K 1/119* (2013.01); *H05K 3/0014* (2013.01);
(Continued)

(58) Field of Classification Search
CPC ..................................................... H05K 3/284
See application file for complete search history.

(56) References Cited

U.S. PATENT DOCUMENTS 9,924,897 B1  3/2018  Abdul-Hafiz
10,856,419 B2 * 12/2020  Loibl ..................... H05K 1/147
(Continued)

FOREIGN PATENT DOCUMENTS

| EP | 3334258 A1 | 6/2018 |
| JP | 2004119508 A | 4/2004 |
| WO | 0104933 A1 | 1/2001 |

OTHER PUBLICATIONS

European Patent Office, International Search Report in corresponding International Application No. PCT/NL2022/050492 dated Dec. 22, 2022.

*Primary Examiner* — Hung V Ngo
(74) *Attorney, Agent, or Firm* — Leydig, Voit & Mayer, Ltd.

(57) ABSTRACT

An electronic device is described that is designed to be more easily recycled at its end of life while maintaining usability during its lifetime. The electronic device includes a first substrate, an encapsulation layer, and a set of electronics disposed there between. One or more delamination layers cover at least one side, preferably both sides, of the set of electronics to separate the set of electronics from at least one, preferably both, of the first substrate and the encapsulation layer. The set of electronics, covered by the one or more delamination layers, is encapsulated between the encapsulation layer and the first substrate. At least one of the (Continued)

delamination layers includes a set of passages filled with material of the encapsulation layer forming a set of interconnections between the encapsulation layer and the first substrate.

18 Claims, 7 Drawing Sheets

(51) Int. Cl.
    *H05K 1/11*     (2006.01)
    *H05K 3/00*     (2006.01)
    *H05K 3/46*     (2006.01)

(52) U.S. Cl.
    CPC ... *H05K 3/4691* (2013.01); *H05K 2201/0108* (2013.01); *H05K 2201/09936* (2013.01); *H05K 2201/10113* (2013.01); *H05K 2201/10128* (2013.01); *H05K 2201/2072* (2013.01); *H05K 2203/074* (2013.01); *H05K 2203/0746* (2013.01); *H05K 2203/0763* (2013.01); *H05K 2203/0783* (2013.01); *H05K 2203/1316* (2013.01); *H05K 2203/1322* (2013.01); *H05K 2203/1327* (2013.01); *H05K 2203/176* (2013.01); *H05K 2203/178* (2013.01)

(56) References Cited

U.S. PATENT DOCUMENTS

| | | | |
|---|---|---|---|
| 2014/0198459 A1* | 7/2014 | Cheng | H01L 21/561 |
| | | | 257/659 |
| 2015/0077961 A1* | 3/2015 | Thiesen | H05K 1/0218 |
| | | | 361/765 |
| 2016/0050763 A1* | 2/2016 | Tang | H05K 3/284 |
| | | | 228/203 |
| 2019/0287892 A1* | 9/2019 | Sääski | H01L 23/50 |
| 2021/0084765 A1* | 3/2021 | Kaess | H05K 1/144 |

* cited by examiner

RECYCLABLE ELECTRONIC DEVICE

CROSS-REFERENCE TO RELATED APPLICATIONS

This patent application is a U.S. National Phase of PCT International Application No. PCT/NL2022/050492, filed Aug. 29, 2022, which claims priority to European Application No. 21193837.8, filed Aug. 30, 2021, which are both expressly incorporated by reference in their entireties, including any references contained therein.

TECHNICAL FIELD AND BACKGROUND

The present disclosure relates to electronic devices and methods of manufacturing and recycling such devices.

Recycling in electronics (e.g. in automotive) is a challenge for the printed electronics (PE) community. Although the PE technology is foreseen as much greener than the printed circuit board (PCB) alternative, the high level of integration makes it very hard to dismantle electronics from the original product, thus disturbing the current recycling cycle. For example, electronics recycling now occurs at PCB level as the package surrounding the PCB is easily removed. In the future electronics will become a part of the complete product (e.g. in structural electronics and 3D printed electronics). At present, PCB boards are grinded to powder, instead of being properly recycled for re-usage. The foil based alternative in PE is therefore already a big step forward. Nevertheless, further improvements are needed to improve recyclability of electronic devices while minimizing impact on manufacturability and usability.

SUMMARY

Some aspects of the present disclosure relate to manufacturing methods for producing an electronic device that is more easily recyclable, e.g. separated into component parts at the end of life. Typically, an electronic device may comprise a stack of layers including a set of electronics disposed between the layers and/or forming one of the layers. To facilitate separation, one or more delamination layers can be provided as part of the stack to cover at least one side of the electronics, preferably both sides. For example, an encapsulation layer can be applied on top of the at least one delamination layer to encapsulate both the electronics and the one or more delamination layers there between. In this arrangement, the one or more delamination layers may keep the electronic components separate from the encapsulation layer and/or other layers of the stack, e.g. (first) substrate on the opposite side of the electronics relative to the encapsulation layer.

Delamination is a process wherein a material or object, in this case the stack, can be separated into layers. This may also be referred to as debonding. As will be appreciated, applying one or more delamination layers to one or both sides of the electronics, may allow relatively easy separation of the electronic components from the substrate and/or encapsulation layer during a later recycling process (after the device end of use). Accordingly, components and/or circuit parts can be more easily separated from the set of electronics without being covered by (stuck to) the substrate or encapsulation layer. This may improve recyclability of the device. By covering both sides of the electronics with a respective delamination layer, the components may be easily separated from both the substrate and encapsulation layer. So the components can be completely isolated during a later recycling process.

By providing select passages through the delamination layer, a limited set of contacts can be established to prevent inadvertent delamination of the substrate during normal use. For example, the solidified material in the passages may form a set of pillars interconnecting the substrate with the encapsulation layer which can provide a relatively strong connection compared to the surrounding areas separated by a delamination layer. These limited connections, e.g. interconnecting pillars, may yet be weak enough to allow breaking apart during a later recycling process. This may further improve usability while maintaining recyclability of the device.

By further extending the area of the at least one delamination layer (beyond the perimeter of the electronics), also surrounding parts of the encapsulation layer and substrate can be separated from each other. So also materials of the substrate and encapsulation layer can be isolated from each other in a later recycling process. This may further improve recyclability of the device. By providing matching sets of passages through each of the delamination surfaces, the substrate and encapsulation layer may be interconnected at respective point to prevent inadvertent delamination during use while still allowing such delamination (by breaking the small connections) during a later recycling process. This may further improve usability while maintaining recyclability of the device.

By covering a relatively large area with one delamination layer also between the substrate and delamination layer, while keeping the area of another delamination layer relatively small to only cover the set of electronics (with possible small margin), full separation of the set of electronics, as well as the substrate and encapsulation layer may be possible while preventing waste of an unnecessary double delamination layer beyond the perimeter of the set of electronics. By placing the set of electronics on the relatively large delamination layer and covering the set of electronics with the relatively small delamination layer, manufacturing can be simplified and/or bending of overhanging layers can be prevented at least in the initial stack manufacturing. For example, the relatively small delamination layer can act as a glob top.

By providing the substrate with a larger total surface area than that of the (largest area) delamination layer, the perimeter edges of the substrate may remain free to directly contact the encapsulation layer. In this way, the delamination layer may be completely encapsulated at the edges between the substrate and encapsulation layer. This may prevent inadvertent delamination at the edges and improve usability of the device. By not extending the edge of the substrate too far beyond that of the largest delamination layer, this may still allow relatively easy separation of the encapsulation layer from the substrate during a later recycling process. By extending the total surface areas of the respective delamination layers shortly beyond the edges of the set of electronics, the electronics may be sufficiently encapsulated and separable from the other layers without unnecessary material waste.

Other or further aspects relate to a recyclable electronic device, e.g. manufactured using the manufacturing methods described herein. The device comprises a substrate, an encapsulation layer, and a set of electronics comprising electronic components. A first delamination layer is disposed between the set of electronics and the substrate and/or a second delamination layer is disposed between the set of electronics and the encapsulation layer. The set of electronics may thus be encapsulated between the first and second delamination layers. Similarly, the encapsulated package including the delamination layers can itself be encapsulated by the substrate and encapsulation layer. Preferably, one or both of the delamination layers comprise a set of passages, e.g. small through holes, filled with material of the encapsulation layer forming a set of interconnections between the encapsulation layer and the substrate.

Other or further aspects relate to recycling methods for recycling an electronic device, e.g. as described herein. In some embodiments, a fluid, e.g. (hot) liquid solvent, is injected into a fluid inlet through the encapsulation layer to the one or more delamination layers (in between the substrate and encapsulation layer). In other or further embodiments, an edge is cut off the substrate and/or encapsulation layer, or a hole is drilled, to expose the delamination layer(s) and the fluid is injected via the exposed edge between the substrate and encapsulation layer. The injected fluid can force the substrate and encapsulation layer apart by a pressure of the injected fluid, and/or the injected fluid dissolves or disintegrates the first and/or second delamination layers. Accordingly the interconnections between the encapsulation layer and the substrate can be broken. In this way the set of electronics may be released from at least one, preferably both, of the substrate and encapsulation layer for recycling one or more of its electronics components. Furthermore, the substrate and encapsulation layers may be isolated from each other for separate recycling.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

Typically, in a conventional injection molded structural electronics (IMSE) part, a plastic substrate is covered by graphic inks, conductive inks and surface mounted device (SMD) components before being injection being molded at the backside. The electronics are thus embedded in plastic, without having the opportunity to separate these again at end of life. Aspects of the present disclosure teach the use of a sacrificial and recyclable layer (referred herein as delamination layer) on which the electronic circuitry and components can be placed. At the end of life, these can be easily peeled off from the larger plastic volumes of the product (front substrate and/or injection molded backside).

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1A:
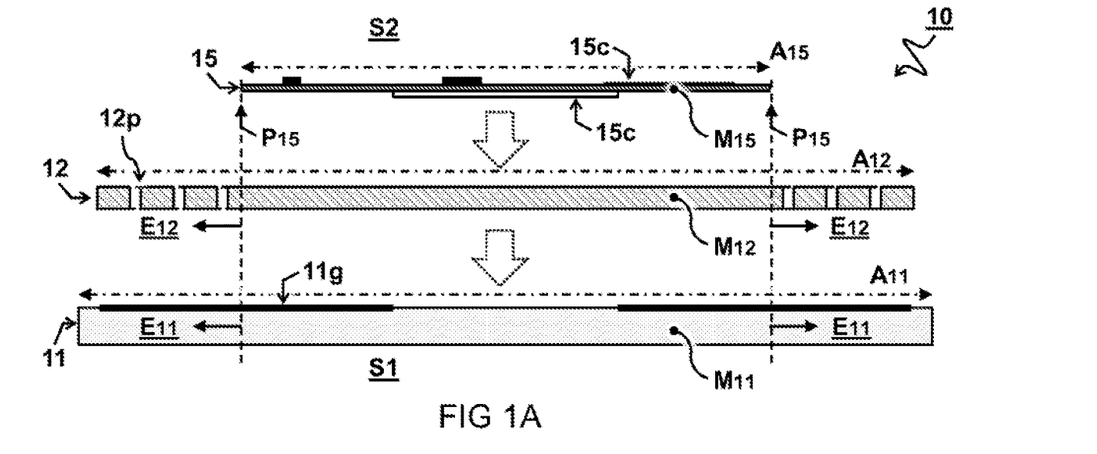
FIGS. 1A-1C illustrate manufacturing an electronic device.
Figure 1B:
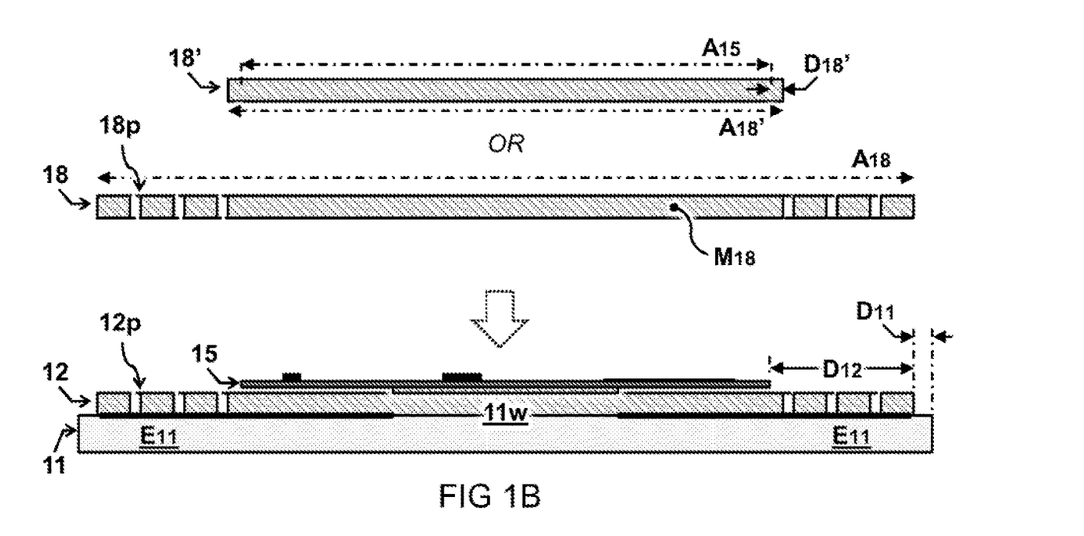
Figure 1C:
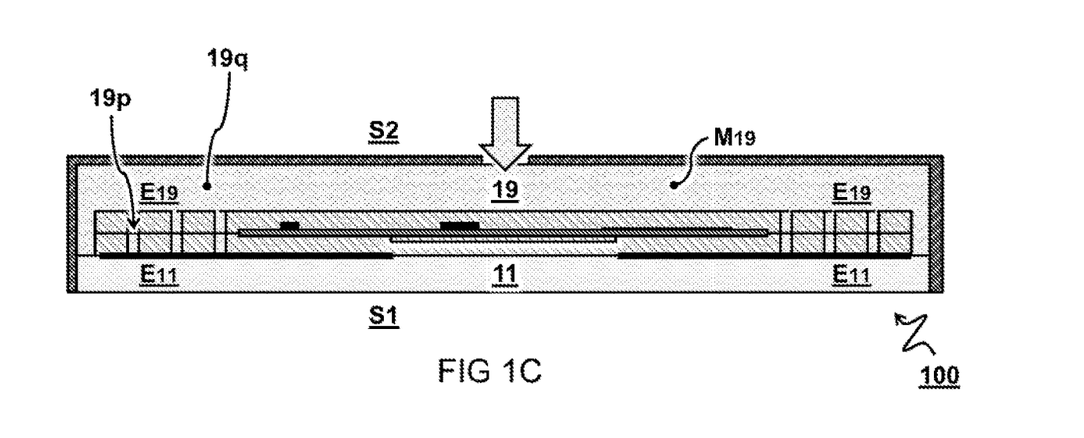

FIGS. 1A-1C illustrate manufacturing a recyclable device 100. In some embodiments, e.g. as illustrated in FIGS. 1A and 1B, a stack 10 of the device comprises a first substrate 11 disposed at a first side S1 of the stack 10. In other or further embodiments, the stack 10 comprises a set of electronics 15. Preferably, the stack comprises at least one delamination layer 12, 18 or 18'. In other or further embodiments, e.g. as shown in FIG. 1C, an encapsulation layer 19 is applied to a second side S2 of the stack 10, opposite the first side S1. Typically, the set of electronics 15 and the at least one delamination layer 12 or 18 are embedded between the applied encapsulation layer 19 and the first substrate 11. Preferably, the at least one delamination layer 12 or 18 covers at least one side of the set of electronics 15 for separating the set of electronics 15 from at least one of the first substrate 11 and set of electronics 15 in a later recycling process. Alternative to a single delamination layer 12 or 18, preferably the stack 10 comprises at least two delamination layers 12 and 18 covering both sides of the set of electronics 15 for more easily separating the set of electronics 15 from both the first substrate 11 and the set of electronics 15 in a recycling process.

In some embodiments, the first substrate 11 may form a front substrate, so the first side S1 may later form the frontside of the resulting device. For example, the encapsulation layer 19 may form a backing layer of the resulting device. Alternatively, the first substrate 11 may form a back substrate and/or the backing encapsulation layer 19 may be at a frontside at the second side S2 of the resulting device. Of course it will be understood that the front or backside designation of the device may depend on the intended use and/or the orientation of the set of electronics, e.g. forming part of a user interface which may include lighting, displays, buttons, user access points, et cetera. It can also be envisaged that both sides of the device comprise a user interface, thus forming two front sides; or that neither side of the device is intended as a user interface (e.g. forming an internal component or device), so the designation of a front side may be arbitrary.

Typically, the set of electronics 15 is formed by an electric circuit, e.g. including circuit lines, with one, two, three, or more electronic components 15c (such as SMD). In some embodiments, e.g. as shown, the set of electronics 15 is formed on at least one separate electronics substrate. In one embodiment, the at least one separate electronics substrate is embedded between the delamination layers 12, 18 (or covered by at least one of the delamination layers 12, 18). For example, a circuit with one or more electronic components 15c is formed on one or both sides of a (flexible) substrate that is embedded between the delamination layers 12, 18. In one embodiment, the separate electronics substrate comprises an OLED device. Also other or further electronic components 15c can be arranged on the electronics substrate such as sensors, e.g. a touch sensitive display. This may allow an at least partially pre-fabricated substrate with components to be applied in the stack while allowing separation in a later recycling process.

In one embodiment, the separate electronics substrate is made of the same material as the delamination layers 12, 18. So, effectively, a stack of at least three layers of delaminating material may be formed including the separate electronics substrate in the middle. This may further facilitate delamination and/or disintegration of the intermediate layers and isolation of the electronics. In another or further embodiment, the separate electronics substrate is made of a different material than the delamination layers 12, 18, e.g. PET, PEN, or any other (preferably flexible) material.

In some embodiments, the resulting device may be a flexible device and/or comprise flexible areas. For example, the encapsulation layer may comprise a relatively thin layer, preferably a flexible hot melt layer and/or other material that stays flexible after solidifying. In other or further embodiments, the resulting device may be a rigid device and/or comprise rigid areas. For example, the encapsulation layer may comprise relatively thick layer and/or a thermohardening material, e.g. injection molded material. Also other or further layers in the stack may be either flexible or rigid.

In some embodiments, some or all of the electronics (e.g. circuit lines, SMD, et cetera) are directly applied onto the stack, e.g. applied on the first substrate 11 and/or a first delamination layer 12 which may cover the first substrate 11. In one embodiment, a set of circuit lines and/or electric electronic components 15c is printed on the stack, e.g. first substrate 11 and/or first delamination layer 12. In another or further embodiment, the set of electronics 15 is electrically connected to (printed) circuit lines. In another or further embodiment, one or more of the set of electronics 15 can be applied by light induced forward transfer (LIFT) or other techniques such as pick and place.

In some embodiments, the first substrate 11 comprises a graphics layer 11g. In one embodiment, an opaque the graphics layer 11g covers a first side view of at least some of the electronics. In another or further embodiment, a transparent or translucent window 11w in the graphics layer 11g may allow light to pass through from one or more lighting devices in the set of electronics, e.g. display or other lighting. In one embodiment, the graphics layer 11g is on the second side of the first substrate 11. So the first delamination layer 12 and/or the set of electronics 15 may be applied onto the graphics layer 11g of the first substrate 11. Alternatively, or in addition, the graphics layer 11g can also be applied to the first side, or the graphics layer 11g can be embedded in the first substrate 11.

In some embodiments, one or both of the delamination layers 12, 18 are printed onto the stack, e.g. using screen printing. Alternatively, one or more of the delamination layers can be applied by laminating a preformed layer. Also other methods can be used, e.g. (spray) coating. Preferably, one or both of the delamination layers 12, 18 comprise respective passages 12p, 18p allowing material M19 of the encapsulation layer 19 to contact the first substrate 11. Preferably, the passages are directly produces by the deposition of the delamination layer, e.g. by printing or laminating a respective pattern. It can also be envisaged to selectively remove parts of a delamination layer, e.g. applied by (spray) coating.

In some embodiments, embodiments, at least one delamination layer 12 or 18 has an extended delamination surface E12, E18 extending beyond a perimeter P15 of the set of electronics 15. Preferably, the extended delamination surface E12, E18 separates also surrounding parts E11, E19 of the first substrate 11 and encapsulation layer 19, which surrounding parts E11, E19 extend beyond the perimeter P15 without the set of electronics 15 there between. In a preferred embodiment, (at least) the extended delamination surface E12, E18 of the at least one delamination layer 12 or 18 comprises the set of passages 12p there through. Alternatively, or in addition, passages can also be provided through the set of electronics 15 (not shown here). For example, in case a separate electronics substrate is used, the substrate may also comprises a set of passages overlapping the passages in the delamination layers 12, 18 on the front and back.

In some embodiments, at least part of the encapsulation layer 19 is applied in at least partially liquified form. In one embodiment, a portion 19p of the at least partially liquified encapsulation layer 19 penetrates into the set of passages 12p to directly contact the first substrate 11. In another or further embodiment, the encapsulation layer 19 (including the portion 19p in the set of passages 12p) is solidified. Accordingly, the solidified portion 19p of the encapsulation layer 19 in the set of passages 12p can form a set connections between the encapsulation layer 19 and the first substrate 11 through the at least one delamination layer 12 or 18.

In a preferred embodiment, the stack 10 comprises at least two delamination layers 12 and 18 covering both sides of the set of electronics 15. In some embodiments, each of the delamination layers 12, 18 comprises a respective set of passages 12p, 18p overlapping each other. In another or further embodiment, the portion 19p of the at least partially liquified encapsulation layer 19 penetrates through the overlapping sets of passages 12p, 18p to contact the first substrate 11. Accordingly, the solidified portion 19p of the encapsulation layer 19 in the first and second sets of passages 12p, 18p can form the set connections between the encapsulation layer 19 and the first substrate 11 through each of the extended delamination surfaces E12, E18. In one embodiment, the at least two delamination layers 12 and 18 each have an extended delamination surface E12, E18 extending beyond the perimeter P15 of the set of electronics 15. Accordingly, at least some of the overlapping passages can be formed through the extended delamination surfaces E12, E18.

Alternatively to both the front and second side delamination layers 12 and 18 having substantially the same surface area (A12≈A18), these layers can have a substantially different area. For example, this is illustrated in FIG. 1B with the relatively small area delamination layer 18' which can be used instead of the relatively large area delamination layer 18 depicted there below. In some embodiments, a first delamination layer 12 has a first extended delamination surface E12 extending a first distance D12 beyond the perimeter P15 of the set of electronics 15, e.g. substrate perimeter of the separate electronics substrate or edge of the electronic components 15c. In other or further embodiments, a second delamination layer 18' has a second extended delamination surface E18' extending a second distance D18' beyond the perimeter P15. Preferably, the second distance D18' is less than the first distance D12. For example, the first distance D12 (margin) of the first delamination layer 12 around the set of electronics 15 is larger than the second distance D18' (margin) of the second delamination layer 18' by at least a factor two, three, five, ten, or more. In other words the first extended delamination surface E12 may have a larger surface area than the extended delamination surface E12, E18, e.g. by at least a factor two, three, five, ten, or more. This is also illustrates e.g. in FIG. 4A.

Figure 4A:
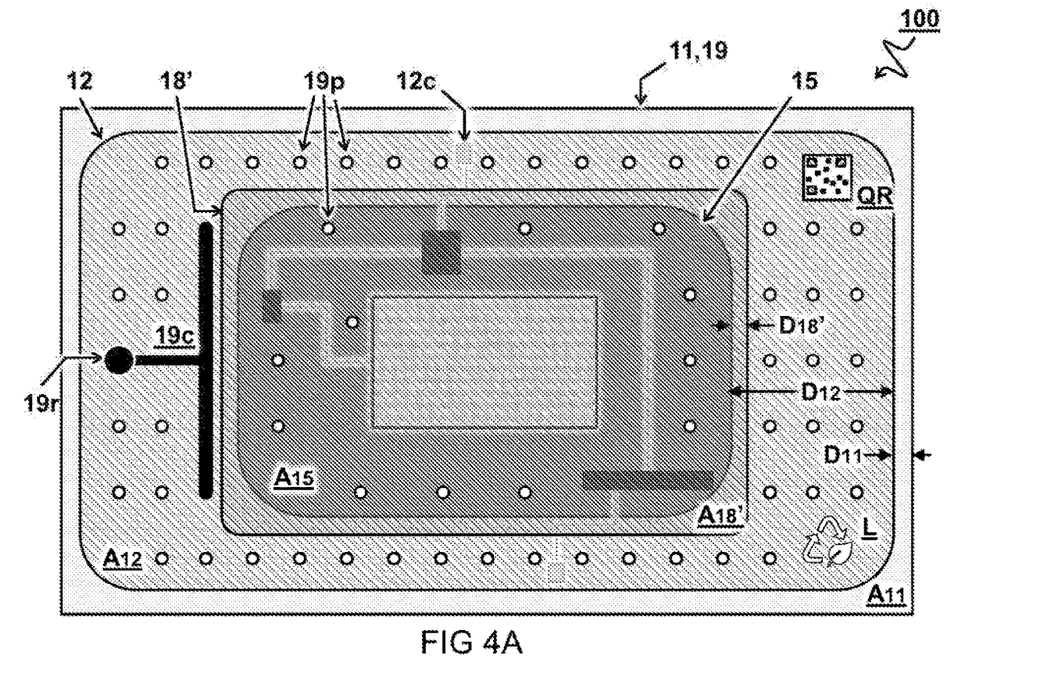
FIGS. 4A and 4B illustrate further aspects of respective electronic devices.

In some embodiments, e.g. as illustrated in FIGS. 1A and 4A, the first delamination layer 12 has a first total surface area A12. As also illustrated, the second delamination layer 18' has a second total surface area A18'. Preferably, the first total surface area A12 is larger than the second total surface area A18', e.g. by at least a factor 1.1, 1.2. 1.5, two, three, or more. Most preferably, the aforementioned (larger) first delamination layer 12 is at the front side S1 of the set of electronics 15 separating the set of electronics 15 from the first substrate 11 and the second delamination layer 18' is at the second side S2 of the set of electronics 15 separating the set of electronics 15 from the encapsulation layer 19.

In some embodiments, e.g. as illustrated in FIG. 1A or 4A, the first substrate 11 has a third total surface area A11. Preferably, the third total surface area A11 is larger than the first total surface area A12 of the first delamination layer 12, e.g. by at least a one percent, at least two percent, at least five percent, at least ten percent, or more. For example, the total surface area of the first delamination layer 12 may comprise a total area encompassed by a circumference of the delamination layer, wherein the total surface area of the respective passages may be subtracted. Preferably, the total surface area of the passages through the respective delamination layer 12 or 18 is relatively small, e.g. less than ten percent of the total area encompassed by a circumference of the delamination layer, preferably less than five percent, or even less than one percent. For example, the passages comprise relatively small pillars and/or thin wall segments as illustrates also in FIGS. 4A and 4B. In other or further embodiments, the third total surface area A11 is larger than the first total surface area A12 of the first delamination layer 12 by less than a factor 1.2 (twenty percent), preferably by less than a factor 1.1 (ten percent), more preferably less than a factor 1.05 (five percent). In another or further embodiment, the margin or distance D11 at which the edge of the first substrate 11 extends beyond the largest delamination layer 12 or 18 may be set in a range to allow on the one hand sufficient encapsulation during use, while also allowing separation during a recycling process. For example, the margin D11 is set in a range between 0.5-10 cm, preferably between one and five centimeter.

In some embodiments, e.g. as illustrated in FIG. 1A or 4A, the set of electronics 15 has a fourth total surface area A15. Preferably, each of the first total surface area A12 and second total surface area A18' is larger than the fourth total surface area A15, e.g. by at least a one percent, at least two percent, at least five percent, at least ten percent, or more. In one embodiment, a circumferential edge of each of the delamination layers 12 and 18 or 18' extends beyond a circumferential edge of the set of electronics 15. In another or further embodiment, the margin or distance D18' at which the edge of the smallest delamination layer 18 extends beyond the edge of the set of electronics 15 may be set in a range to allow on the one hand sufficient encapsulation of the set of electronics, while preventing unnecessary material waste. For example, the margin D18' is set in a range between 0.5-10 cm, preferably between one and five centimeter, or up to and not including the set of passages 12p in the larger delamination layer.

Alternatively to the arrangement shown in FIG. 1B, the roles of the first and back delamination substrates 12 and 18' can also be reversed, e.g. with the smaller back delamination substrate 18' on the first side S1 separating the set of electronics 15 from the first substrate 11 and the larger front delamination substrate 12 on the second side S2 separating the set of electronics 15 from the encapsulation layer 19. So it will be understood that the surfaces areas A12 and A18' and relative sizes, as well as the (relative or absolute) distances D12 and D18' described herein can also be reversed.

Alternatively, or in addition to the layers shown, also other or further layers can be provided. In some embodiments, one or more (colored) ink layers are provided between the first substrate 11 and encapsulation layer 19. For example, an esthetic and/or functional coating can be provided such as a reflective (e.g. white) coating, an absorptive (e.g. black) coating, a light guide between the first substrate 11 and set of electronics 15, et cetera. In other or further embodiments, the stack comprises a logo or other pattern. For example, the stack comprises a human and/or machine readable pattern such as a bar code, QR code, or other indication informing or instructing about the way in which the device can be recycled. In one embodiment, such pattern is created in the first delamination layer 12, e.g. as shown in FIG. 4A In some embodiments, the first substrate 11 comprises or essentially consists of a first substrate material M11. For example, the first substrate material M11 comprises or essentially consists of polymer and/or plastic material, preferably a thermoplastic material. Suitable materials may e.g. include polymethylmethacrylate (PMMA), thermoplastic polyurethane (TPU), (PVB), polyvinyl butyral (PVB), polycarbonate (PC), (thermoformable) polyethylene terephthalate (PET), polyimide (PI) and/or polyethylene naphthalate (PEN). Also recyclable and/or bio-based materials, e.g. polylactic acid (PLA), polyethylene furanoate (PEF), cellulose mono/di/tri-acetate (CA, CDA, CTA), poly(3-hydroxybutyrate-co-3-hydroxyhexanoate) (PHBH), polyhydroxyalkanoates (PHA), may be used for the substrate and/or other layers and components described herein.

In some embodiments, the set of electronics 15 is formed on a separate electronics substrate which comprises or essentially consists of a substrate or film of material M15 onto which the circuit with one or more electronic components 15c is placed. Preferably, the electronics substrate is a flexible substrate, e.g. capable of bending around a radius of one meter without breaking and/or losing essential functionality. For example, the flexibility may depend on the choice of a flexible material and/or relative thickness of the substrate. Alternatively, or in addition, the electronics substrate may be formed (largely) of the same material as the first substrate 11 (which is typically rigid but may also be flexible). Also similar or different materials can be used. The set of electronics 15 typically comprises electronics components 15c on one or both sides of the substrate. For example, the electronics components 15c may include (printed) circuit components such as silver ink and/or include surface mounted devices (SMD) and/or thin film components such as OLEDs, displays, lighting, sensors, et cetera. Some components, such as the SMD, may be relatively rigid. Optionally, an additional, e.g. local, graphic layer, buffer layer and/or adhesive layer can be applied to cover and/or better adhere the SMD or other components.

In some embodiments, the encapsulation layer 19 comprises or essentially consists of an encapsulation layer material M19. In one embodiment, the encapsulation layer 19 is applied by injection molding, e.g. using the stack as front part of the mold. In another or further embodiment, the encapsulation layer material M19 comprises or essentially consists of a resin, preferably an injection moldable resin, e.g. thermosetting polymer. Also other types of polymers and/or plastics can be used. Also other molding techniques can be used to apply the encapsulation layer 19, e.g. vacuum molding. In some embodiments, the same material is used as the first substrate 11. This may improve bonding between the encapsulation layer 19 and first substrate 11. Suitable materials may e.g. include polycarbonate (PC) and/or polyethylene naphthalate (PEN). Also other or further materials can be used such as Acrylonitrile Butadiene Styrene (ABS), polyethylene (PE), polypropylene (PE), and/or polystyrene (PC). For example, vacuum molding, preferably an epoxy resin is used. Also bio-based materials can be used. The encapsulation layer 19 may also be applied as a hot melt material, e.g. hot melt adhesive or layer and/or substrate. Similar to a molding material, the hot melt material be (temporarily) liquified (e.g. by elevated temperature and/or pressure) to enter the set of passages 12, 18 through one or both of the encapsulation layers. For example, this may reinforce the connection between the encapsulation layer 19 and first substrate 11 while still allowing delamination during a recycling process.

In some embodiments, the at least one (or each) delamination layer 12 and/or 18 comprises or essentially consists of a delamination layer material M12, M18. The delamination layer materials M12, M18 may be the same or different materials. Preferably, the delamination layer material is formed from an ink, e.g. applied by (screen) printing, coating, and/or (thermal/UV) curing. The set of passages 12p may be formed during application of the first substrate material M11, e.g. printing, or afterward by selectively removing material, or before (e.g. if the delamination layer is applied as pre-formed substrate or film).

In some embodiments, the set of electronics 15 is separable from the first substrate 11 and/or encapsulation layer 19 by the delamination layer material M12, M18 being dissolvable and/or disintegrable by a solvent, preferably a non-toxic solvent. Preferably, the solubility is more than 0.1 gram per 100 milliliter of solvent, more preferably ≥1 g/100 mL, ≥10 g/100 mL, ≥100 g/100 mL, or without limit (fully miscible). The higher the solubility, the more easily the delamination layer material may be dissolved. In one embodiment, the delamination layer material M12, M18 is soluble in water. For example, the delamination layer material is based on aqueous polymers. For example, the delamination layer is configured to form a lacquer between the respective layers.

In some embodiments, the solubility of the delamination layer material M12, M18 in a respective solvent such as water is higher than the solubility of the first substrate material M11 and/or encapsulation layer material M19 in the respective solvent, e.g. higher by at least a factor ten, fifty, hundred or more. Most preferably, the first substrate material M11 and/or encapsulation layer material M19 is essentially insoluble in the respective solvent, e.g. insoluble in water. The more insoluble the first substrate material M11 and/or encapsulation layer material M19, the better may be the structural integrity be maintained during normal use.

In other or further embodiments, the set of electronics 15 is separable from the first substrate 11 and/or encapsulation layer 19 by the delamination layer material M12, M18 having a relatively low melting point, liquification/softening temperature and/or glass transition temperature compared to the first substrate material M11 and/or encapsulation layer material M19, e.g. at least ten, twenty, fifty, or hundred degrees Celsius lower and/or in absolute sense preferably less than 200° C., or even less than 150° C. For example, the first substrate material M11 may have relatively high melting point, liquification/softening temperature and/or glass transition temperature so it does not soften during normal use, e.g. staying solid at least up to hundred degrees Celsius, preferably at least up to 200° C. or 250° C.

In other or further embodiments, the set of electronics 15 is separable from the first substrate 11 and/or encapsulation layer 19 by the delamination layers 12, 18 and/or their materials M12, M18 having a relatively weak adhesive force per surface area to each other and/or to the first substrate 11 and/or to the encapsulation layer 19 and/or to the substrate material M15 of the optional electronics substrate—at least compared to a relatively strong adhesive force between the first substrate 11 and encapsulation layer 19 (without any delamination layer there between), e.g. lower (in Newton per square meter) by at least a factor two, three, five, ten or more. Also other types of separation can be envisaged.

In one embodiment, the aforementioned relatively weak adhesive force of any of the layers to the delamination layer is less than ten Newton per square centimeter, preferably less than one Newton per square centimeter, more preferably less than 0.5 N/cm$^2$, most preferably less than 0.1 N/cm$^2$. In another or further embodiment, the aforementioned relatively strong adhesive force between the layers, without the delamination layer there between, is be more than one Newton per square centimeter, preferably more than 10 N/cm$^2$, or even ≥100 N/cm$^2$. In particular, the relatively strong adhesive force may exceed the structural integrity of the materials/layers, e.g. the layers may be torn when trying to separate them. As will be appreciated, the size and/or number and/or arrangement of passages through the at least one delamination layer can be adapted to tune the effective adhesive force between the values of the relatively weak adhesive force of the delamination layer, as such, and the relatively strong force where the delamination layer is absent.

Figure 2A:
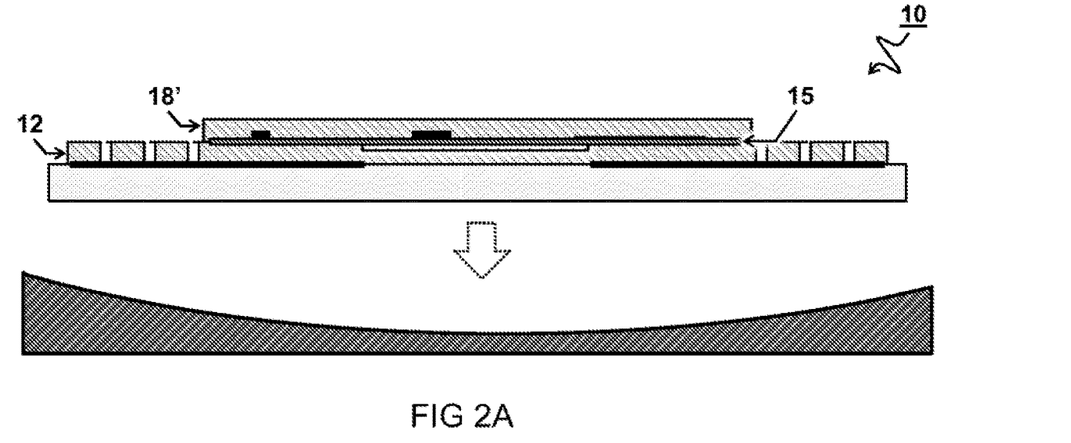
FIGS. 2A-2C illustrate manufacturing a non-planar device.
Figure 2B:
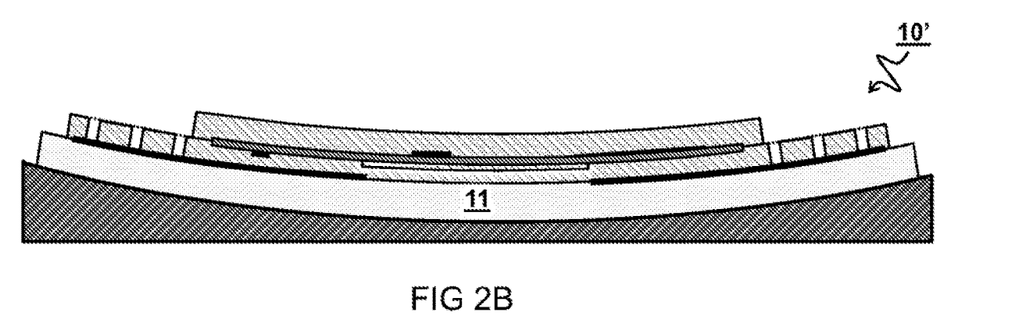
Figure 2C:
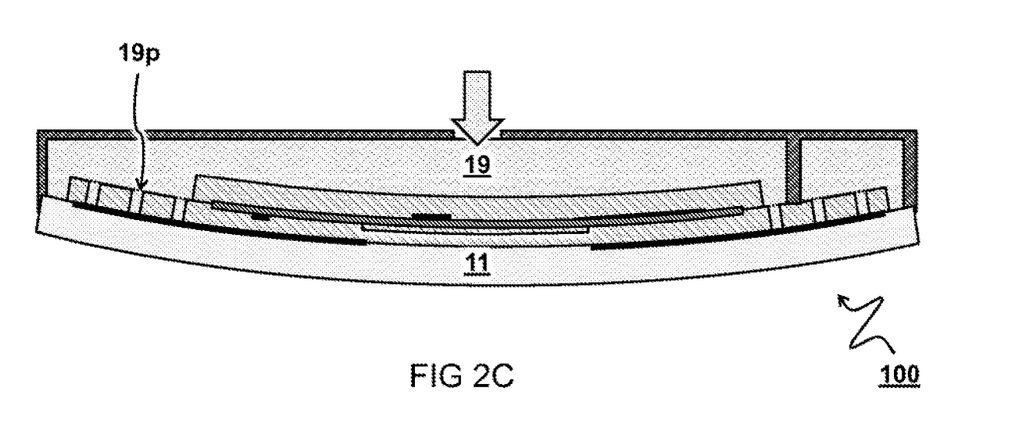

FIGS. 2A-2C illustrate manufacturing a non-planar device 100. In some embodiments, at least part of the stack 10 is initially planar and deformed into a non-planar shape 10'. For example, one or more (preferably all) of the first substrate 11, the (first side or bottom) first delamination layer 12, the set of electronics 15 and the (second side or top) second delamination layer 18', are initially stacked in a planar (flat) formation. Alternatively, the stack may be built directly in a non-planar shape, e.g. providing a pre-formed non-planar first substrate 11 and applying the subsequent (flexible and/or printed) layers 12, 15, 18 onto the non-planar first substrate 11. Also combinations are possible, e.g. deforming part of the stack including the first substrate 11, first delamination layer 12 and the set of electronics 15 while applying the second delamination layer 18' (or 18) onto the deformed stack, e.g. by (screen) printing or otherwise.

In a preferred embodiment, the stack 10 is deformed prior to applying the encapsulation layer 19. This may allow easier access to the second side, e.g. for connecting electronics. For similar reason, also the second delamination layer 18' can be applied after deformation (but before applying the encapsulation layer). For example, the encapsulation layer can be applied as a resin into a back side mold connected to the non-planar stack 10' as shown in FIG. 2C. Alternatively, or additionally, also other types of encapsulation layer can be envisaged being applied after or before deforming the stack 10.

In some embodiments, the stack 10 is deformed by a thermoforming process. For example, this may involve heating the stack to an elevated temperature and/or pressing the stack into a mold as shown in FIG. 2B. Also other or further deformation processes can be used, e.g. vacuum forming. Advantageously, the delamination layer 12 can additionally function as a thermal and/or mechanical buffer layer between the first substrate 11 and set of electronics 15 during the deformation process. This may, e.g., help to protect electronic components, such as an OLED, during deformation and/or heating.

In one embodiment, the thermoforming process comprises applying heat to the stack 10 for causing a temperature of at least the first substrate 11 and buffer layer (delamination layer 12) to increase to a respective processing temperature at which the respective materials become pliable. For example, the first substrate 11 and/or delamination layer 12, comprise thermoplastic materials. In another or further embodiment, the stack 10 is thermoformed while the thermoplastic materials are pliable to form the non-planar (curved) device 100.

Preferably, the (thermoplastic) buffer layer material (e.g. delamination material) has a lower stiffness at the respective processing temperature than the first substrate material. In other words, the buffer layer material is more flexible or pliable, i.e. more easily deformed, than the first substrate material, at least during the thermoforming process. Such properties can e.g. help to alleviate thermal and/or mechanical stress being passed to the set of electronics 15 thus allowing at least some, preferably all, of the electronic components 15c to be advantageously included in the stack already during the deformation process. Alternatively, or in addition, some or all of the electronics components (especially more sensitive components) may be placed and/or connected after the deformation process.

In some embodiments, the buffer layer material has a lower elastic and/or plastic modulus than the first substrate material at the same or similar processing temperature. Alternatively, or additionally, the temperature of the buffer layer can remain lower than the temperature of the first substrate 11 during the thermoforming. For example, the buffer layer material has a lower glass transition temperature and/or melting temperature than the first substrate material, e.g. lower by at least five or ten degrees, preferably more. In this way, when applying heat, the energy ca first be used to cause substantial phase change in the buffer layer 12 at a relative low temperature, whereas the first substrate 11 may reach a higher temperature before substantial phase change occurs. In some embodiments, the buffer layer material may be softened or even (partially) melted while the first substrate material is less softened, at least not melted. So while the stack is deformed, a flow of the buffer layer material can substantially buffer mechanical stresses between the first substrate 11 and electronic components, e.g. OLED display, while the melting or other phase transition can also take up a substantial portion of heat energy.

Figure 3A:
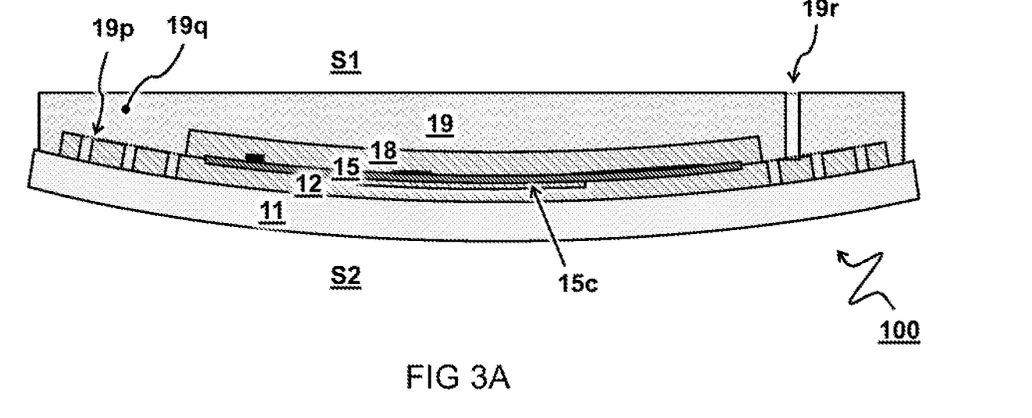
FIG. 3A illustrates a recyclable device.

FIG. 3A illustrates a recyclable device 100. In some embodiments, the device 100 comprises a first substrate 11 at a first side S1 of the device 100, an encapsulation layer 19 at a second side S2 of the device 100, and a set of electronics 15 comprising a set of electronic components 15c. In some embodiments, a first delamination layer 12 is disposed between the set of electronics 15 and the first substrate 11. In other or further embodiments, a second delamination layer is disposed between the set of electronics 15 and the encapsulation layer 19. Preferably, the set of electronics 15 is encapsulated by the first and second delamination layers 12, 18. More preferably, the first and second delamination layers 12, 18 are themselves encapsulated by the first substrate 11 and the encapsulation layer 19. In some embodiments, the one or more delamination layers 12, 18 comprise a set of passages 19p filled with material of the encapsulation layer 19 forming a set of interconnections between the encapsulation layer 19 with the first substrate 11. In a preferred embodiment, the one or more delamination layers are dissolvable, e.g. in water or other solvent (preferably non-toxic). Most preferably, the first substrate 11 and encapsulation layer 19 are resistant to being dissolved or corroded during normal use. For example, the first substrate 11 and encapsulation layer 19 shield the embedded delamination layers during normal use from possible solvents such as water.

In some embodiments, the encapsulation layer 19 comprises a fluid inlet 19r formed by an open passage extending from an exterior of the encapsulation layer 19 to the one or more delamination layers 12, 18 inside the device between inside surfaces of the first substrate 11 and encapsulation layer 19. In one embodiment, the fluid inlet 19r is sealed during use of the device for preventing exposure of the one or more delamination layers 12, 18 to an external surroundings. For example, the fluid inlet 19r is sealed by a sealing material or object, wherein the sealing is removable for implementing a recycling process.

Figure 3B:
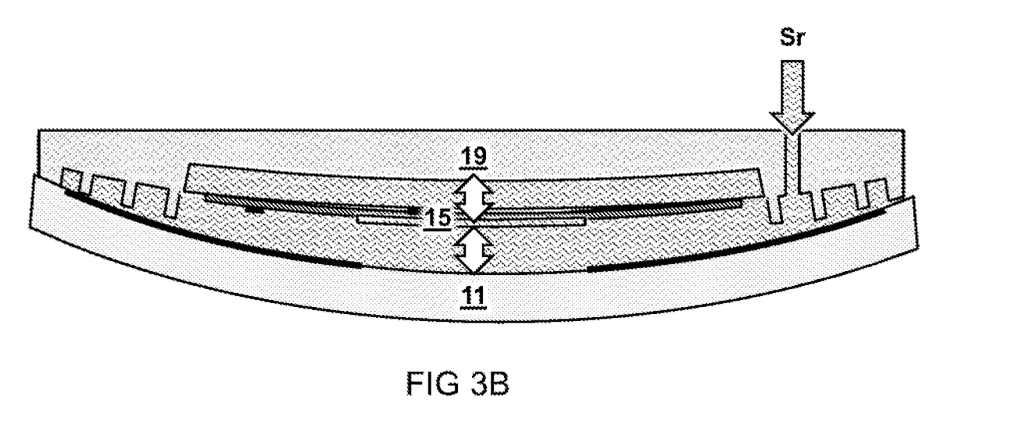
FIGS. 3B and 3C illustrate recycling the device.
Figure 3C:
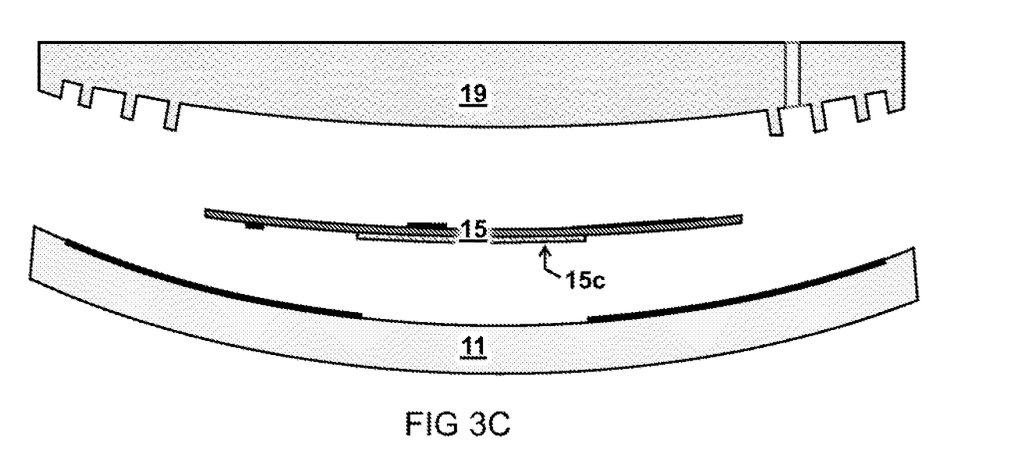

FIGS. 3B and 3C illustrate a recycling method for recycling the device 100, e.g. manufactured according to the manufacturing method as described herein or otherwise.

In some embodiments, a fluid Sr, e.g. liquid solvent, is injected into a fluid inlet 19r through the encapsulation layer 19 to the one or more delamination layers 12, 18 in between the first substrate 11 and encapsulation layer 19. Other or further embodiments (not shown), may comprise cutting an edge off the first substrate 11 and encapsulation layer 19, and/or drilling a hole through the first substrate 11 and/or encapsulation layer 19 to expose the one or more delamination layers 12, 18. For example, the fluid Sr can be injected via the exposed edge or hole between the first substrate 11 and encapsulation layer 19. In one embodiment, the injected fluid Sr forces the first substrate 11 and encapsulation layer 19 apart, e.g. by a pressure of the injected fluid. In another or further embodiment, the injected fluid Sr dissolves or disintegrates the one or more delamination layers 12, 18. Accordingly, the set of interconnections between the encapsulation layer 19 and the first substrate 11 can be broken and the set of electronics 15 can be released from at least one, preferably both, of the first substrate 11 and encapsulation layer 19 for recycling one or more of the electronics components 15c. Preferably, the fluid is heated to further facilitate dissolving, melting and/or other disintegration of the delamination layer(s). For example, the injected fluid has a temperature of more than 50° C., or even more than 100° C. For example, hot water and/or steam can be injected. Also other liquids and/or gasses can be injected.

In other or further embodiments (not shown), a recycling method for recycling a device 100 comprises irradiating and/or heating the device. For example, the radiation and/or heat causes melting or disintegration of the one or more delamination layers 12, 18 facilitating separation of the set of electronics 15 from the first substrate 11 and/or encapsulation layer 19. For example, the one or more delamination layers 12, 18 comprise at least one of a reversible adhesive, hot melt material, and/or low Tg material. For example, the one or more delamination layers 12, 18 comprise a material that disintegrates under influence of microwave, ultraviolet, visible or IR radiation. Also other types of delamination triggering can be envisaged, e.g. embedding a photoacid and/or gas generating material in the one or more delamination layers 12, 18. For example, gas generated in the delamination layers e.g. triggered by (UV) light and/or chemical trigger (e.g. reacting with the injected fluid Sr, may cause expansion in between the first substrate 11 and encapsulation layer 19 to facilitate delamination during a recycling process.

While the present figures illustrate the set of electronics 15 being completely separated from the first substrate 11 and encapsulation layer 19, it may also be envisaged that the set of electronics 15 is separated only from one of the first substrate 11 and encapsulation layer 19. For example, a delamination layer 12 or 18 may be provided only on one side of the electronics. Nevertheless, at least some of the advantages described herein may be achieved by exposing the set of electronics 15 from at least one side. Furthermore, while the present figures illustrate the first substrate 11 completely separating from the encapsulation layer 19, this may not be necessary to remove the set of electronics there between. For example, some or all of the electronic components and other circuit parts may be flushed with from the device, e.g. via the fluid inlet 19r and/or fluid outlet (not shown).

Figure 4B:
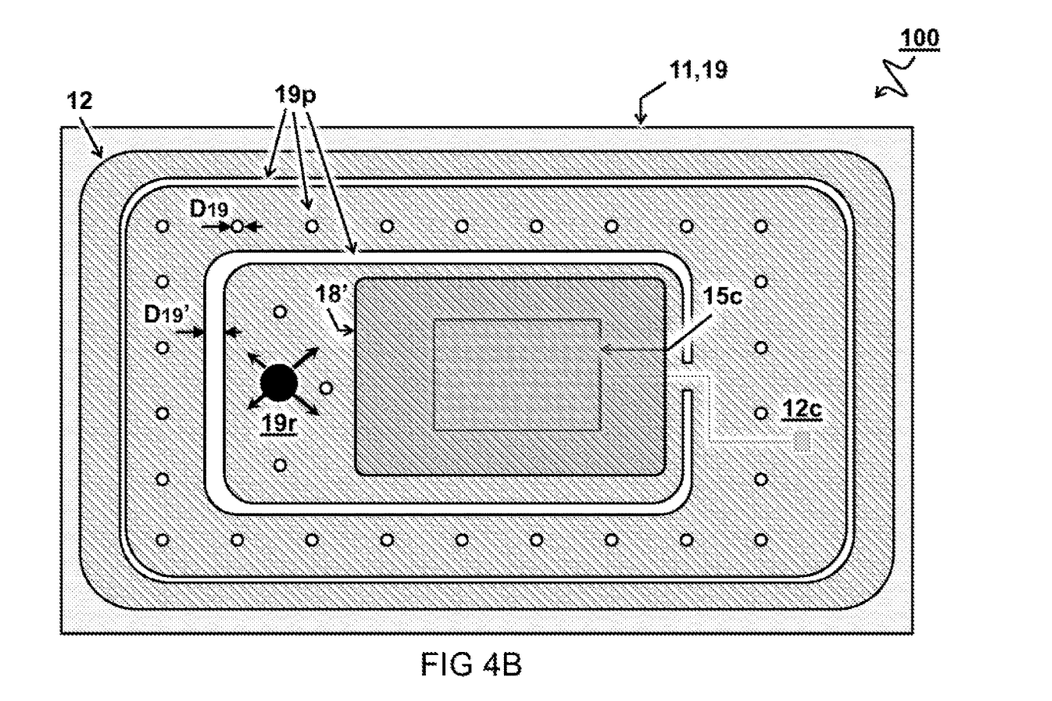

FIGS. 4A and 4B illustrate further aspects of respective devices 100. In some embodiments, the fluid inlet 19r is connected to a channel 19c along a surface of the device between the first substrate 11 and encapsulation layer 19 to guide an injected fluid Sr towards different parts of the one or more delamination layers 12, 18. In one embodiment, the channel branches in different paths. In another or further embodiment (not shown), multiple fluid inlets are provided to access different parts of the one or more delamination layers 12, 18.

In some embodiments, the one or more delamination layers 12, 18 are provided with circuitry 12c. For example, the circuitry on a delamination layer can be connected to the set of electronics 15 on a separate substrate, or the electronic components 15c can be directly placed on one or more of the delamination layers 12, 18. Circuit parts can also be provided on other or further layers described herein. In one embodiment, circuit lines are printed onto one or more layers, e.g. the optionally separate electronics substrate, the one or more delamination layers 12, 18, the first substrate 11, and/or the encapsulation layer 19. Electronic components also be placed on other or further layers, in addition or alternatively to the electronic components on the electronics substrate. For example, the respective circuit lines are printed or otherwise applied on a respective layer, and/or respective components are placed after respective deposition of a respective layer and/or circuit lines. Also electric vias or through holes can be provided to interconnect circuitry on different layers.

In some embodiments, a logo L and/or computer readable instructions, e.g. QR code, is embedded in the device 100. Advantageously, the respective pattern can be produced while printing the one or more delamination layers 12, 18. The pattern can simultaneously act as one or the set of passages, i.e. forming a respective connection through the delamination layer(s).

In some embodiments, respective connections 19p are formed not only through one or more delamination layers 12, 18, but also in between the set of electronics 15. For example, the set of electronics 15 and/or separate electronics substrate is provided with a set of passages that is aligned with passages in the one or more delamination layers 12, 18. Connection may run through the whole stack from the encapsulation layer 19 to the first substrate 11, or part way, e.g. interconnecting the encapsulation layer 19 with some of the electronic components or substrate and/or interconnecting some of the electronic components or substrate with the first substrate 11.

In some embodiments, the set of connections 19p formed in the respective passages include one or more pillars, e.g. round structures having relatively small diameter D19, e.g. between 0.01 mm and 5 mm, preferably between 0.05 and 1 mm. By keeping the pillars relatively small, it may be prevented that they are very visible through the device. In other or further embodiments, e.g. as shown in FIG. 4B, the set of connections 19p formed in the respective passages include one or more wall segments. For example, the wall segments are arranged around the fluid inlet 19r to guide the fluid. In one embodiment, a thickness of the wall segments is relatively large to allow sufficient pressure buildup and/or ballooning of the delaminated layers before the respective wall segments rupture. For example, the wall segments have a diameter D19' in a range between 0.1 mm and 10 mm, preferably between 0.5 and 5 mm. A distance between adjacent connections 19p (pillars, walls, or other structures) may vary. This distance may be smaller to prevent inadvertent delamination or the distance may be larger to facilitate separation during recycling. For example, the (largest distance) between connections can be selected in a range between 0.5 and 50 cm, preferably between one and ten centimeter.

Figure 5A:
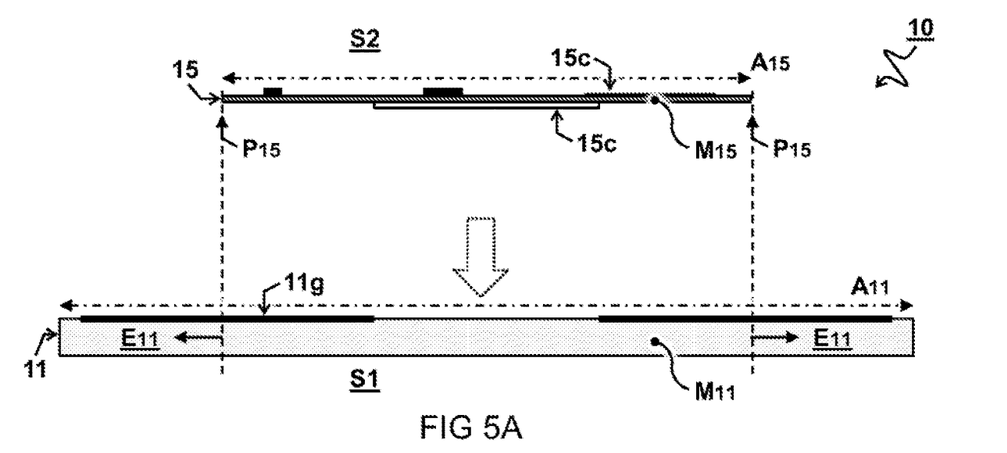
FIGS. 5A-5C illustrate manufacturing an electronic device with one delamination layer.
Figure 5B:
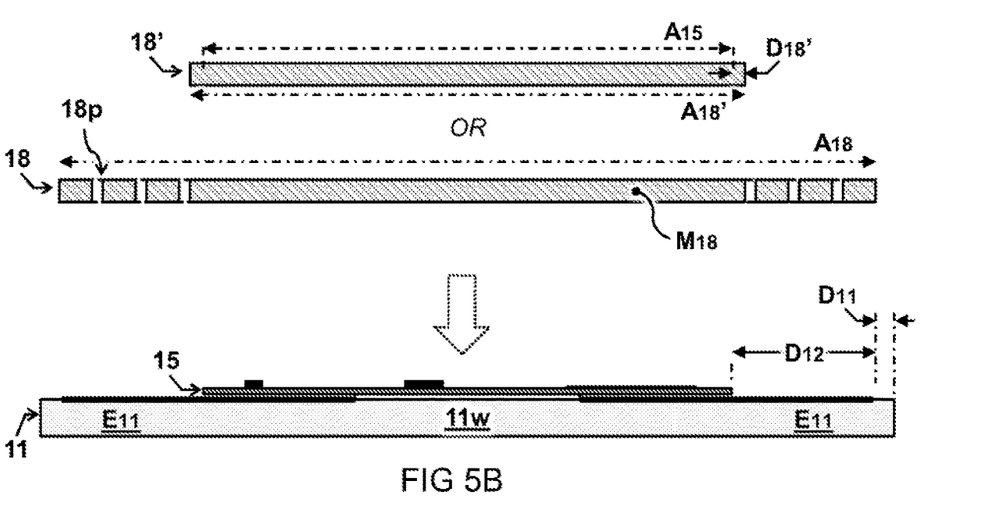
Figure 5C:
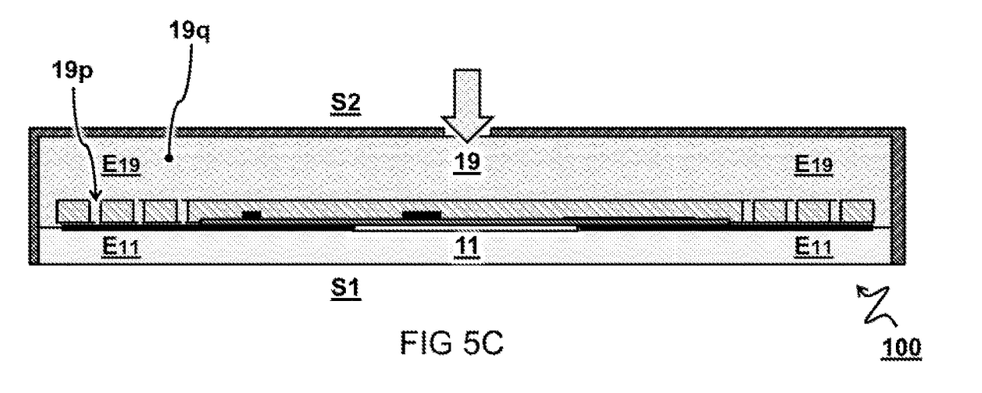

FIGS. 5A-5C illustrates a method for manufacturing a recyclable electronic device 100 having a delamination layer 18 covering a set of electronics 15 arranged on a substrate 11. In one embodiment, e.g. as shown in FIGS. 5A, the set of electronics 15 is provided directly on the first substrate 11 without delamination layer there between. For example, a set of circuit lines is printed or otherwise applied onto the first substrate 11, and a set of electronics 15 is electrically connected to the circuit lines. Alternatively, or additionally a separate electronics substrate can be provided. In another or further embodiment, e.g. as shown in FIG. 5B, the delamination layer 18 is provided to cover the set of electronics 15 on the first substrate 11. For example, compared to the previous described embodiments, the first delamination layer 12 may be omitted. Advantageously, the remaining delamination layer 18 may still allow relatively easy separation of the electronic components 15 on the first substrate 11 from the encapsulation layer 19 during a later recycling process (after the device end of use). Accordingly, the electronic components 15 may be easily exposed for removal from the first substrate 11. While the figure shows the set of electronics 15 being manufactured on a separate substrate which is provided directly on the first substrate 11, the set of electronics 15 can also be directly manufactured on the first substrate 11 without requiring a separate substrate. For example, the set of electronics 15 may be integrally formed as part of the first substrate 11.

Alternatively to omitting the first delamination layer 12, as illustrated in the present FIGS. 5A-5C, it can be envisaged that the second delamination layer 18 is omitted while the first delamination layer 12 is provided between the set of electronics 15 and the first substrate 11. In this case, the delamination layer 12 may allow relatively easy separation of the electronic components 15 (on a separate electronics substrate or manufactured on the delamination layer 12) from the first substrate 11. Accordingly, the electronic components 15 may be exposed for facilitating removal, e.g. from the encapsulation layer 19. In any case, it will be appreciated that the features described with reference to the preceding figures (such as thermoforming et cetera), may be applied mutatis mutandis while omitting either one of the delamination layers 12, 18 to achieve at least some of the advantages of easy separation and/or at least partial exposure of the set of electronics 15, thus allowing a more efficient recycling process.

Figure 6A:
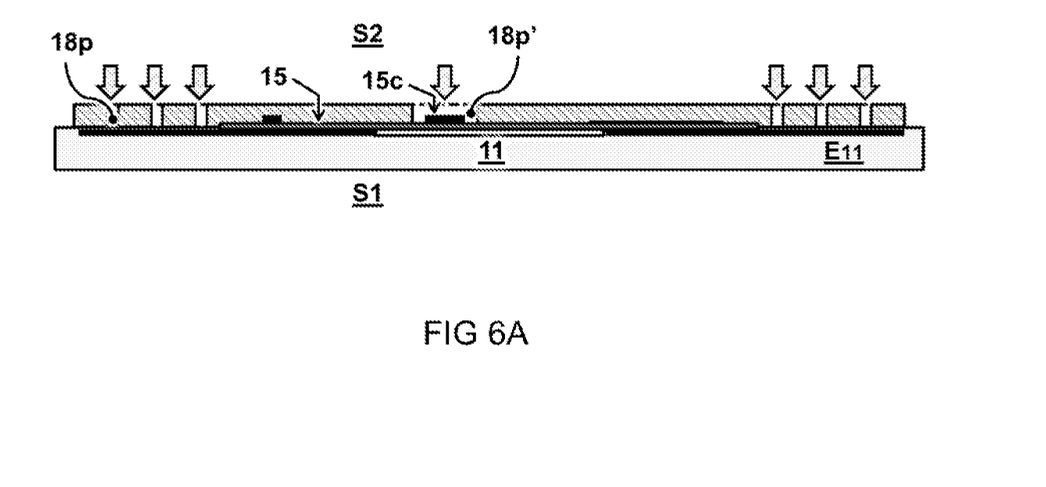
FIGS. 6A-6C illustrate application of an encapsulation layer in two steps.
Figure 6B:
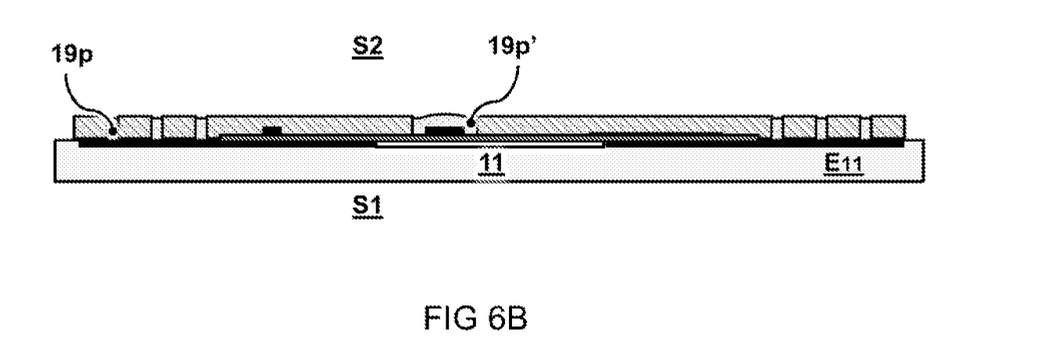
Figure 6C:
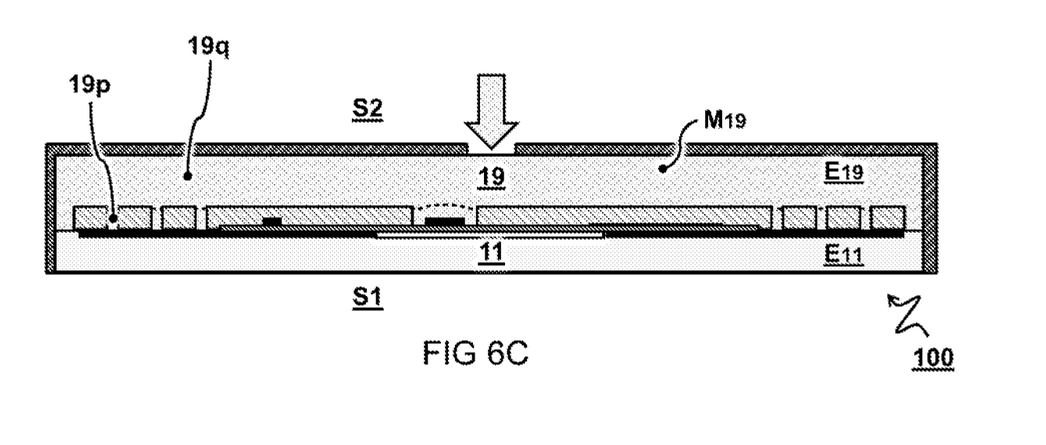

In one embodiment, e.g. as shown in FIG. 5B, the delamination layer 18, covering the set of electronics 15, is provided with a set of passages 18p there through. In another or further embodiment, e.g. as shown in FIG. 5C, the encapsulation layer 19 is applied in at least partially liquified form, wherein a first portion 19p of the at least partially liquified encapsulation layer 19 penetrates into the set of passages 18p to directly contact the first substrate 11. In another or further embodiment, the encapsulation layer 19 including the first portion 19p in the set of passages 18p is solidified, wherein the solidified first portion 19p of the encapsulation layer 19 in the set of passages 12p, 18p forms a set of connections between a second portion 19q of the encapsulation layer 19 and the first substrate 11 through the delamination layer 18. Of course, it will be understood that, in case the first delamination layer 12 (not shown here) is maintained while the second delamination layer 18 is omitted, the set of passages may be provided through the first delamination layer 12 and filled with the at least partially liquified encapsulation layer. While the present figure shows the encapsulation layer 19 being applied using an injection molding FIGS. 6A-6C illustrates how the encapsulation layer 19 may be applied in multiple steps. In one embodiment, e.g. as shown in FIG. 6A, a first portion 19p of the encapsulation layer 19 is provided in at least partially liquified form to penetrate into a set of passages 18p of at least one delamination layer 18 to directly contact the first substrate 11 and/or set of electronics 15 disposed on the first substrate 11. While the present figure shows a single delamination layer 18, also a further delamination layer (12, not shown here) may be provided between the set of electronics 15 and the first substrate 11, as described above.

In some embodiments, e.g. as shown in FIG. 6B, the at least partially liquified first portion 19p is solidified in the set of passages 18p of the at least one delamination layer 18. In other or further embodiments, e.g. as shown in FIG. 6C, a second portion 19q of the encapsulation layer 19 is provided to directly contact the first portion 19p of the encapsulation layer 19 in the set of passages 19p. In one embodiment, the second portion 19q of the encapsulation layer 19 is provided after the first portion 19p is partially or completely solidified in the set of passages 18p.

In some embodiments, the second portion 19q is provided in at least partially liquified form and thereafter solidified while in contact with the first portion 19p in the passages. In one embodiment, the at least partially liquified second portion of the encapsulation layer is solidified while contacting the solidified first portion 19p of the encapsulation layer 19 in the set of passages 18p such that the solidified first portion 19p of the encapsulation layer 19 in the set of passages 18p forms the set connections between a second portion of the encapsulation layer 19 and the first substrate 11 through the at least one delamination layer 18. Preferably, the first portion 19p of the encapsulation layer 19 comprises or (essentially) consists of the same or similar material M19 as the second portion 19p, so that an integral connection may be formed. Alternatively different materials can be used.

By applying the encapsulation layer in separate steps, the method of application may be different, so that the most suitable process can be selected. In one embodiment, the second portion of the encapsulation layer 19 is applied by an injection molding process. In another or further embodiment, the first portion 19p of the encapsulation layer 19 is applied by another process such as spray coating, dip coating and/or spin coating. In some embodiments, one or more of the set of passages 18p and/or 18p' are formed around a respective electronic component 15c. In other or further embodiments, the electronic component(s) 15c is (are) globtopped. In another or further embodiment, the glob-topping may form part of the encapsulation layer. So, it will be understood that the glob-topping may be equivalent and/or fulfil the role of at least some of the solidified first portion 19p of the encapsulation layer 19 in the set of passages 12p, 18p. For example, the glob-topping comprises or (essentially) consists of the same material or similar as used for applying the second portion 19q of the encapsulation layer 19. Alternatively, or additionally, some or all of the glob-topping may comprise or (essentially) consists of the same or similar material (M12, M18) as the delamination layer(s) 12 and/or 18. For example, this may help to later release the electronic component(s). Also other or further materials facilitating delamination can be used as described herein, e.g. water soluble materials and/or materials with heat-induced mobility and/or phase changes (at a temperature before the other materials in the stack disintegrate). Alternatively, or additionally, one or more of the electronic components can be provided with an intrinsic delaminating material and/or layer, which can facilitate delaminating the later applied glob-topping material e.g. the same or similar material as used for applying the second portion 19q of the encapsulation layer 19. Also combinations are possible, e.g. applying the material of the backing layer in at least some of the passages (e.g. 18p) for ensuring connection through the delamination layer; and applying a delamination material as globtopping for one or more electronic components 15c (e.g. at the passage 18p'). In any case, the glob-topping may help to protect the electronic component 15c, e.g. from a subsequent injection molding process and/or thermoforming process. Alternatively to an injection molding process, the second portion of the encapsulation layer 19 may also be applied as a hot melt adhesive encapsulating the at least one delamination layer, e.g. forming connection to the glob-topping and/or other material in the set of passages through the at least one delamination layer.

Figure 7A:
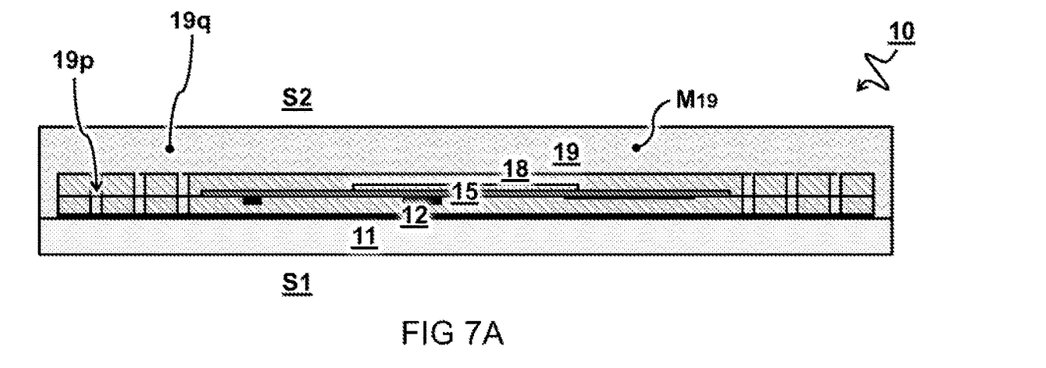
FIGS. 7A-7C illustrate applying further layers.
Figure 7B:
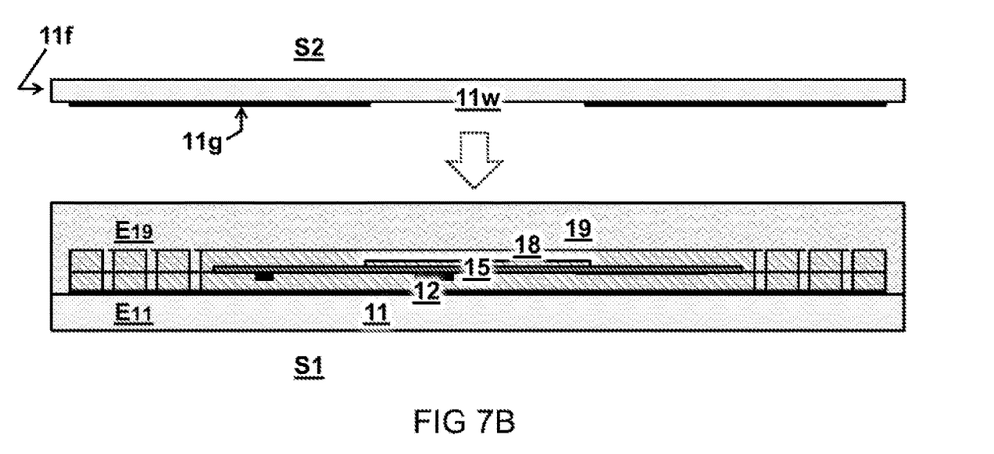
Figure 7C:
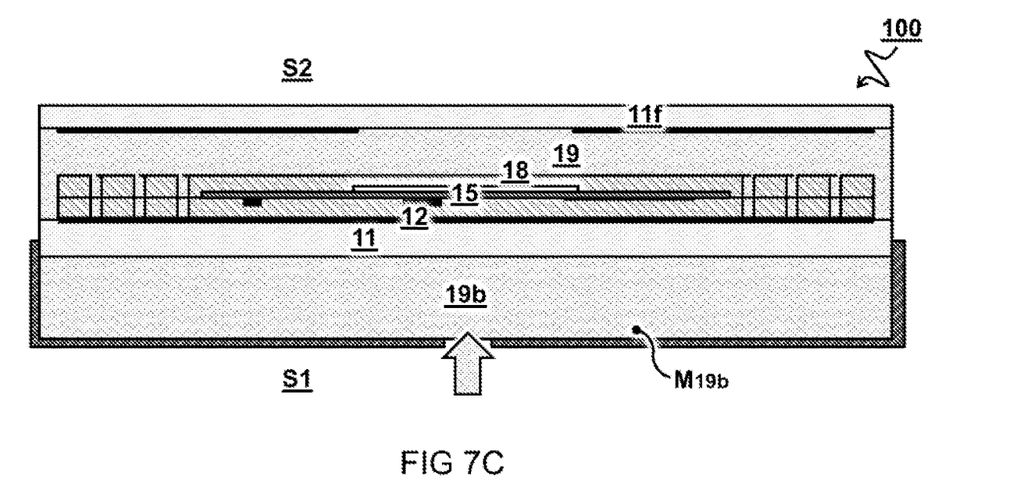

FIGS. 7A-7C illustrate application of possible further layers. In one embodiment, e.g. as shown in FIG. 7A a stack 10 is provided. For example, the stack 10 may be the same or similar as the device 100 resulting from the method as described with reference to FIGS. 1A-1C. In some embodiments, e.g. as shown in FIG. 7B, a second substrate 11f is applied on the second side S2 of the stack 10. In other or further embodiments, an encapsulation layer 19 is provided between the second substrate 11f and the delamination layer 18. In one embodiment, e.g. as shown, the second substrate 11f is applied after the encapsulation layer 19 is formed, e.g. as described with reference to FIG. 1C. In another embodiment (not shown), the encapsulation layer 19 is formed between the second substrate 11f and the rest of the stack. For example, the second substrate 11f may be present and/or form a boundary while the encapsulation layer 19 is applied using an injection molding process.

In some embodiments, the second substrate 11f comprises a graphics layer 11g. The graphics layer 11g may form a window 11w or other pattern depending on the functionality of the device. For example, the window 11w may allow passage of light from the set of electronics 15. In this case, the second side S2 may form a front side of the device. Of course the directionality may also be reversed and a graphics layer can be provided on the first substrate 11 as described with reference to FIGS. 1A-1C. Graphics layers can also be provided on both the first and second substrates. For example, the graphics layer on the backside may cover the whole device.

In some embodiments, a reinforcement layer 19b is applied to the stack. For example, this may act as a (further) reinforcement of the device. Preferably, the reinforcement layer 19b comprises, or (essentially) consists of the same or similar material M19b as the material M19 forming the encapsulation layer 19. Also other materials can be used. Depending on the orientation of the device, the reinforcement 19b may form a backing layer of the device or a front side of the device. In one embodiment, the reinforcement layer 19b is applied by injection molding. In another or further embodiment, the reinforcement layer 19b is applied after and/or during a thermoforming process. For example, the reinforcement layer 19b may be applied in a similar way as the encapsulation layer 19 described with reference to FIGS. 2A-2C. While the present figures show the reinforcement layer 19b being applied after the second substrate 11f, the sequence can also be reversed, or the second substrate 11f may be omitted.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise.

The invention claimed is:

1. A method for manufacturing a recyclable electronic device, the method comprising:
   providing a stack comprising:
     a first substrate disposed at a first side of the stack,
     a set of electronics comprising a circuit with electronic components, and
     one or more delamination layers covering at least one side of the set of electronics;
   applying an encapsulation layer to a second side of the stack, opposite the first side, that encapsulates the one or more delamination layers between the applied encapsulation layer and the first substrate,
   wherein the one or more delamination layers separate the set of electronic components from the first substrate and/or the encapsulation layer;
   wherein at least one of the one or more delamination layers comprises a set of passages there through;
   wherein the encapsulation layer is applied in at least partially liquified form,
   wherein a first portion of the at least partially liquified encapsulation layer penetrates into the set of passages to directly contact the first substrate;
   wherein the encapsulation layer, including the first portion in the set of passages is solidified, and
   wherein the solidified first portion of the encapsulation layer in the set of passages forms a set of connections between a second portion of the encapsulation layer and the first substrate through the at least one delamination layer.

2. The method according to claim 1, wherein the delamination layers comprise:
   a first delamination layer disposed between the first substrate and the set of electronics, and
   a second delamination layer,
   wherein, in applying the encapsulation layer to the second side of the stack, the delamination layers are encapsulated between the applied encapsulation layer and the first substrate, wherein the set of electronics is embedded between the delamination layers and separates the electronic components from both the first substrate and the encapsulation layer.

3. The method according to claim 1,
   wherein the one or more delamination layers have a relatively weak adhesive force per surface area to each other and/or to the first substrate and/or to the encapsulation layer compared to an adhesive force between the first substrate and the encapsulation layer without any delamination layer there between.

4. The method according to claim 1,
   wherein each delamination layer of the delamination layers comprises a respective set of passages overlapping each other,
   wherein the portion of the at least partially liquified encapsulation layer penetrates through the overlapping sets of passages to contact the first substrate; and
   wherein the solidified portion of the encapsulation layer in the first set of passages and the second set-sets of passages forms the set of connections between the encapsulation layer and the first substrate through each of the extended delamination surfaces.

5. The method according to claim 1, wherein at least a first delamination layer of the one or more delamination layers is printed onto the stack,
   wherein a set of circuit lines is printed onto the first delamination layer, and
   wherein the set of electronics is electrically connected to the circuit lines.

6. The method according to claim 1,
   wherein the set of electronics is formed on a separate electronics substrate embedded between the one or more delamination layers.

7. The method according to claim 1, wherein the first substrate forms a front surface of the electronic device, and
   wherein the first substrate comprises a graphics layer covering a frontside view of at least some of the electronics while leaving a window for one or more lighting devices in the set of electronics.

8. The method according to claim 1, wherein the one or more delamination layers comprise:
   a first delamination layer disposed between the set of electronics and the first substrate, and
   a second delamination layer, disposed between the set of electronics and the encapsulation layer;
   wherein a surface of the first delamination layer is larger than a surface of the second delamination layer, wherein a perimeter of the larger first delamination layer encompasses a perimeter of the second delamination layer, and wherein a perimeter of each delamination layer encompasses a perimeter of the set of electronics.

9. The method according to claim 1, wherein a surface of the first substrate is larger than a surface of each of the one or more delamination layers with a perimeter of both the first substrate and encapsulation layer encompassing a respective perimeter of each of the one or more delamination layers.

10. The method according to claim 1, wherein at least part of the stack is initially planar and deformed into a non-planar shape by a thermoforming process.

11. The method according to claim 1, wherein the stack is deformed after applying a least some of the set of electronics onto the stack and prior to applying the encapsulation layer.

12. A recyclable electronic device manufactured according to method of claim 1, the electronic device comprising:
  a first substrate;
  an encapsulation layer;
  a set of electronics comprising a circuit with electronic components disposed between the first substrate and the encapsulation layer;
  one or more delamination layers covering at least one side, preferably both sides, of the set of electronics,
  wherein the one or more delamination layers separate the set of electronics from the first substrate and/or the encapsulation layer;
  wherein the set of electronics, covered by the one or more delamination layers, is encapsulated between the encapsulation layer and the first substrate;
  wherein at least one of the one or more delamination layers comprises a set of passages there through,
  wherein the set of passages are filled with material of the encapsulation layer that form-forming a set of interconnections through the one or more delamination layers between the encapsulation layer and the first substrate.

13. The recyclable electronic device according to claim 12, wherein the one or more delamination layers are dissolvable in water.

14. The recyclable electronic device according to claim 12, wherein the encapsulation layer comprises a fluid inlet formed by an open passage extending from an exterior of the encapsulation layer to the one or more delamination layers inside the device between inside surfaces of the first substrate and the encapsulation layer.

15. The recyclable electronic device according to claim 12, wherein the one or more delamination layers comprise a delamination layer material,
  wherein, compared to of either one or both of a first substrate material of the first substrate and an encapsulation layer material of the encapsulation layer, the delamination layer material has at least one characteristic of the group consisting of:
  a relatively high solubility in a non-toxic solvent;
  a relatively low melting point,
  relatively low liquification or softening temperature,
  relatively low glass transition temperature; and
  a relatively weak adhesive force per surface area to adjacent layers.

16. The method according to claim 1, wherein the one or more delamination layers comprise a delamination layer material, wherein, compared to either one or both of a first substrate material of the first substrate and an encapsulation layer material of the encapsulation layer, the delamination layer material has at least one characteristic of the group consisting of:
  a relatively high solubility in a non-toxic solvent;
  a relatively low melting point,
  relatively low liquification or softening temperature,
  relatively low glass transition temperature; and
  a relatively weak adhesive force per surface area to adjacent layers.

17. A method for recycling an electronic device,
  wherein the electronic device comprises:
    a stack comprising:
      a first substrate disposed at a first side of the stack,
      a set of electronics comprising a circuit with electronic components, and one or more delamination layers covering at least one side of the set of electronics;
    applying an encapsulation layer to a second side of the stack, opposite the first side, that encapsulates the one or more delamination layers between the applied encapsulation layer and the first substrate,
    wherein the one or more delamination layers separate the set of electronic components from the first substrate and/or the encapsulation layer;
    wherein at least one of the one or more delamination layers comprises a set of passages there through,
    wherein the encapsulation layer is applied in at least partially liquified form,
    wherein a first portion of the at least partially liquified encapsulation layer penetrates into the set of passages to directly contact the first substrate;
    wherein the encapsulation layer, including the first portion in the set of passages is solidified, and
    wherein the solidified first portion of the encapsulation layer in the set of passages forms a set of connections between a second portion of the encapsulation layer and the first substrate through the at least one delamination layer; and
  wherein the method comprises:
    injecting a fluid into the fluid inlet through the encapsulation layer to the one or more delamination layers in between the first substrate and the encapsulation layer;
    wherein the fluid injected into the fluid inlet forces the first substrate and encapsulation layer apart by a pressure of the injected fluid, and/or the injected fluid dissolves or disintegrates the one or more delamination layers; and
    wherein the set of interconnections between the encapsulation layer and the first substrate are broken and the set of electronics is exposed to the injected fluid, the set of electronics being released from at least one, preferably both, of the first substrate and the encapsulation layer for recycling one or more of the electronics components.

18. The method according to claim 17, wherein the one or more delamination layers comprise a delamination layer material, wherein, compared to of either one or both of a first substrate material of the first substrate and an encapsulation layer material of the encapsulation layer, the delamination layer material has at least one characteristic of the group consisting of:
  a relatively high solubility in a non-toxic solvent;
  a relatively low melting point,
  relatively low liquification or softening temperature,
  relatively low glass transition temperature; and a relatively weak adhesive force per surface area to adjacent layers.

* * * * *